United States Patent
Beroz et al.

(10) Patent No.: US 6,215,191 B1
(45) Date of Patent: Apr. 10, 2001

(54) COMPLIANT LEAD STRUCTURES FOR MICROELECTRONIC DEVICES

(75) Inventors: Masud Beroz, Milpitas; Konstantine Karavakis, Cupertino; Thomas H. DiStefano, Monte Sereno, all of CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/281,460

(22) Filed: Mar. 30, 1999

Related U.S. Application Data

(62) Division of application No. 08/560,272, filed on Nov. 21, 1995.

(51) Int. Cl.$^7$ ............................. H01L 23/48; B32B 3/30
(52) U.S. Cl. ........................ 257/775; 257/690; 257/673; 257/674; 257/669; 257/696
(58) Field of Search ...................... 257/690, 696, 257/698, 776, 775, 669, 666, 674, 673; 438/111, 123

(56) References Cited

U.S. PATENT DOCUMENTS

| | | | |
|---|---|---|---|
| 2,869,053 | * | 1/1959 | Schaper . |
| 4,289,834 | * | 9/1981 | Alcorn et al. ................. 428/601 |
| 4,339,287 | * | 7/1982 | Matsumoto et al. ........... 148/111 |
| 4,531,981 | * | 7/1985 | Singer ........................... 148/676 |
| 4,749,548 | * | 6/1988 | Akutsu et al. ................. 420/469 |
| 4,754,318 | * | 6/1988 | Momose et al. ............... 257/775 |
| 4,807,798 | * | 2/1989 | Eylon et al. ................... 228/190 |
| 4,872,048 | * | 10/1989 | Akutsu et al. ................. 257/741 |
| 4,924,276 | * | 5/1990 | Heime et al. .................. 257/99 |
| 5,032,468 | * | 7/1991 | Dumont et al. ................ 428/636 |
| 5,071,619 | * | 12/1991 | Hosoda et al. ................. 420/507 |
| 5,117,275 | * | 5/1992 | Bregman et al. .............. 257/776 |
| 5,148,265 | | 9/1992 | Khandros et al. . |
| 5,230,144 | | 7/1993 | Ootsuki . |
| 5,268,236 | * | 12/1993 | Dumont et al. ................ 428/636 |
| 5,331,895 | * | 7/1994 | Bourne et al. ................. 102/307 |
| 5,476,530 | * | 12/1995 | Gries et al. ..................... 75/238 |
| 5,491,302 | | 2/1996 | DiStefano et al. . |
| 5,512,327 | * | 4/1996 | Chakraborty .................. 427/455 |
| 5,536,909 | * | 7/1996 | DiStefano et al. ............. 174/261 |
| 5,559,372 | * | 9/1996 | Kwon ............................. 257/692 |
| 5,629,239 | | 5/1997 | DiStefano et al. ............. 430/111 |
| 5,682,061 | * | 10/1997 | Khandros et al. ............. 257/666 |
| 5,701,028 | * | 12/1997 | Waki ............................... 257/666 |
| 5,763,952 | * | 6/1998 | Lynch et al. ................... 257/735 |
| 5,787,581 | * | 8/1998 | DiStefano et al. ............. 29/884 |
| 5,821,608 | * | 10/1998 | DiStefano et al. ............. 257/669 |
| 5,864,745 | * | 1/1999 | Kawagoe et al. .............. 428/553 |
| 5,873,988 | * | 2/1999 | Schulze et al. ................ 204/290 F |
| 5,989,727 | * | 11/1999 | Yates et al. .................... 428/607 |

OTHER PUBLICATIONS

Park, et al., A Practical Excimer Laser–Based Cleaning Tool for Removal of Surface Contaminants, IEEE Transactions on Components, Packaging, and Manufacturing Technology, Part A, vol. 17, No. 4, Dec. 1994, pp. 631–643.

* cited by examiner

*Primary Examiner*—Alexander O. Williams
(74) *Attorney, Agent, or Firm*—Lerner, David, Littenberg, Krumholz & Mentlik, LLP

(57) ABSTRACT

A method of treating a lead in a chip package. A conductive lead is positioned such that it extends across a gap in a dielectric substrate and is secured at either end to a first surface of the substrate. Directed energy is then applied to a desired portion of the surface of the lead within the gap. As a result of the application of energy, a surface layer of the lead is recrystallized thereby creating a fine grain, dense surface layer of lead material. Surface contaminates may be vaporized and contaminants at the grain boundaries of the recrystallized surface layers may be driven away from the grain boundaries such that a treated lead is more ductile and has better resistance to thermal cycling after the lead has been attached to a chip contact.

30 Claims, 6 Drawing Sheets

COMPLIANT LEAD STRUCTURES FOR MICROELECTRONIC DEVICES

This application is a Divisional of application No. 08/560,272, filed Nov. 21, 1995.

FIELD OF THE INVENTION

The present invention relates generally to the packaging of microelectronic devices, and more particularly to a method of treating a conductive lead for a semiconductor chip package.

BACKGROUND OF THE INVENTION

Modem electronic devices utilize microelectronic devices and semiconductor chips (generically referred to herein as "chips") which incorporate numerous electronic elements. These chips are mounted on circuitized substrates which provide physical support and further electrically interconnect each chip with other elements of the circuit. A discrete chip package, equipped with terminals for interconnection to the external circuit elements, may be used to hold a single chip. Alternatively, in a so-called "hybrid circuit", one or more chips are mounted directly to a package forming a circuit panel arranged to interconnect the chips and the other circuit elements mounted to the substrate. In either case, the chip must be securely held on the substrate and must be provided with a reliable electrical interconnection to the substrate. The interconnection between the chip itself and its package is commonly referred to as "first lever assembly or chip interconnection, as distinguished from the interconnection between the package and the other elements of the circuit, commonly referred to as a "second level" interconnection.

The structures utilized to provide the first level connection between the chip and the package must accommodate all of the required electrical interconnections to the chip. The number of connections to external circuit elements, commonly referred to as "input-output" or "I/O" connections, is determined by the structure and function of the chip. Advanced chips capable of performing numerous functions may require substantial numbers of I/O connections.

The first level interconnection structures connecting a chip to a substrate ordinarily are subject to substantial strain caused by thermal cycling as temperatures within the device change during operation. The electrical power dissipated within the chip tends to heat the chip and substrate, so that the temperatures of the chip and substrate rise each time the device is turned on and fall each time the device is turned off. As the chip and the substrate ordinarily are formed from different materials having different thermal coefficients of expansion ("TCE") and because all of the heat will be generated within the chip and not within the substrate, the chip and substrate expand and contract by different amounts and at different times. This causes the electrical contacts on the chip to move relative to the electrical contact pads on the substrate as the temperature of the chip and substrate changes. This relative movement deforms the electrical interconnections between the chip and substrate and places them under mechanical stress. Such thermal cycling stresses are applied repeatedly with repeated operation of the device, and can cause electrical and mechanical failure of the interconnections.

The thermal stresses at the first level interconnection are exacerbated when a chip size package is used. A chip size package is typically a package which is attached to and fits on the face surface of the operational portion of a chip. In such a package, all of the package dimensions are reduced thereby reducing the first level interconnection features which traditionally have absorbed much of the thermal cycling stresses. As a result, these interconnection features are placed under substantially more stress and strain and it becomes very important to have features which minimize the size of the package while simultaneously maximizing the compliancy of the first level interconnection. This is also true for chip scale packages which are typically just slightly larger than the operational portion of the chip. Commonly assigned U.S. Pat. No. 5,148,265 discloses improvements in semiconductor chip assemblies and methods of making the same. As more fully set forth in the '265 patent, a semiconductor chip having peripheral contacts and a central region of the chip disposed inwardly from the peripheral contacts is connected to a sheet-like dielectric, and preferably flexible, interposer. The interposer overlies the central region of the contact bearing surface of the chip. A first surface of the interposer faces towards the chip whereas a second surface faces away from the chip. The interposer further has outward edges disposed inwardly of the peripheral contacts on the chip. Terminals are disposed on the second surface of the interposer overlying the central portion of the chip such that the terminals are exposed at the second surface for interconnection to a substrate. Typically, these terminals will be bonded to a substrate by a surface mount soldering process. A conductive lead extends from at least some of the terminals to an outward edge of the interposer. The connection sections of the leads further extend beyond the edge and are connected to one of the peripheral contacts. The connection sections of the leads flex and/or distort in response to thermal cycling stress due to operation of the chip thereby allowing the central terminals to be moveable with respect to the chip contacts providing excellent resistance to the thermal stress problem. The package described in the '265 patent may also include a compliant layer disposed between the first surface of the interposer and the top surface of the chip.

Typically, the most cost effective method of creating the leads on such a package is to plate metal in circuit patterns within defined areas on a surface of the interposer. After the lead plating operation, a bonding gap is removed from the dielectric material of the interposer. The interposer can then be juxtaposed with the chip and a bonding tool can be used to shape and bond the leads to contacts on the face of the chip within the bonding gap using thermocompression, ultrasonic energy or a combination thereof. However, typical plating processes create porous, coarse grained lead structures having large, non-planar surface variations. In fact, the density of the plated leads ranges from about 90 to 98 percent due to the porosity problem. During operation of the packaged chip, the leads have high stress regions due, in part, to the coarse grain and the porosity of the plated leads, both of which serve as sites which weaken the lead and accelerate fatigue fractures. As chip packages are made smaller and thus the dimensions of the package's leads are likewise made smaller, the surface non-planarities and the lead porosity due to the plating operation also become a larger factor in obtaining a good intermetallic bond between a lead and its respective chip contact. As mentioned above, the leads are typically bonded using a combination of heat, force and/or ultrasonic energy over time. A lead which has large surface variations will be more difficult to bond without causing a weak portion of the lead at the outer edge of the bond. Another problem caused by the surface variations is the difficulty in obtaining a uniform bond between the lead and a chip contact so that Kirkendahl voiding problems do not occur to weaken the bond, as described in more detail below.

In attempting to achieve high plating speeds for mass production of parts, plating operations also typically leave contamination on the surface of the leads and in the grain boundaries of the leads. Common reasons for contamination of the leads are poor quality control in the plating baths (thus allowing stray contaminates from sources such as photoresist breakdown, etc.), grain refining additives intentionally placed in the solutions (such as thallium, arsenic, or lead) which may co-deposit themselves with the plated metal, and (in the case of gold plating baths) from a concentration of cyanide and cyanide polymers due to the replenishment of potassium gold cyanide. Further, hydrogen (which is a possible by product of gold plating) entrapment increases the hardness of plated gold. There are other reasons for such contamination which are too numerous to mention in any detail here. Certain processes have been utilized to help rid plated metals of contamination, such as pulse plating to refine the grain structures of the plated metal without added grain refiners by using higher plating currents thereby allowing less of a chance for large grains to develop. However, even with these processes, contaminants plague the deposited metal thereby causing a potential for embrittlement of the lead.

As mentioned above, the surface variations and the surface contaminants of the plated leads can impede the creation of a good bond between the chip contacts and their respective leads by allowing only a portion or portions of a lead's surface to create an intermetallic bond with the chip contact. The surface variations themselves impede the formation of a good lead/chip contact bond by only creating a bond at the top portions of the surface variations. Intermetallic diffusion will typically only take place at these bonded sites thereby causing sites of gross intermetallic formation which may cause an unreliable bond. Further, impurities in the lead (such as the co-deposited plated lead impurities or other surface impurities) may migrate to the intermetallic sites during the high temperatures used in chip packaging thus weakening the bond. Both of these problems may worsen the creation of a phenomenon called Kirkendahl Voiding (voids created at the boundary of two metals having different interdiffusion coefficients). This voiding along the boundary of the two metals (lead/contact) generally causes intermetallic degradation and brittleness of the lead itself making the lead/bond susceptible to failure during thermal cycling. Plated lead impurities which co-deposit at the grain boundaries may also make the leads less ductile and thus more susceptible to fatigue during thermal cycling.

Despite the substantial time and effort devoted heretofore to the problems associated with providing an inexpensive yet reliable package lead, there are still unmet needs for improvements in such semiconductor chip package structures and methods.

SUMMARY OF THE INVENTION

The present invention provides a method of treating a bond ribbon lead for chip packaging which solves the aforementioned problems in the art.

In a method of treating a lead in a chip package according to one embodiment of the present invention, conductive bond ribbon leads are positioned such that they extend over a gap in a dielectric substrate at least one end being secured to a first surface of the substrate. A controlled amount of directed energy is then applied to at least a portion of the surface of the lead within the gap and impinges upon the exposed leads. A mask may be used to protect the surrounding material while allowing the energy to be applied to the desired portion of the surface of the leads. A surface layer (up to a desired thickness) of the leads is thereby recrystallized. This recrystallization of the lead's surface layer creates a more ductile lead which, it is believed, better enables the lead to compensate for the TCE mismatch problems during thermal cycling of the chip package. Various factors will control the recrystallization process, such as bond ribbon lead material, type of directed energy, etc. After the recrystallization of the surface layer, typically the surface layer will have a finer grain than that found in the untreated portions of the lead. In some embodiments, the recrystallized surface layer may actually be temporarily melted and resolidified creating the aforementioned fine grain, recrystallized structure. Other non-limiting examples of beneficial effects which may also occur due to the application of the directed energy include smoother exposed surfaces on the lead, densification of the surface layer of lead material and removal of contamination from the surface of the lead and within the surface layer of the lead. In some embodiments of the present invention, various surface contaminates are vaporized upon recrystallization of the surface layer of the lead, while other contaminates co-deposited in the lead plating operation are driven away from the grain boundaries within the surface layer and into the grain itself. Lead features should be also taken into account when applying the directed energy to the lead so that the features are not deformed or do not collapse under their own weight during the period of energy application. Thus, the application of the directed energy acts to reduce localized stresses in the bonded lead during thermal cycling and further reduces the risk of contaminates having a detrimental affect on the intermetallic bond between the lead and a chip contact.

The foregoing and other objects and advantages of the present invention will be better understood from the following Detailed Description of a Preferred Embodiment, taken together with the attached Figures.

DETAILED DESCRIPTION OF A PREFERRED EMBODIMENT

In a method of treating a bond ribbon lead in a chip package according to the present invention as shown in FIG.

Figure 3:
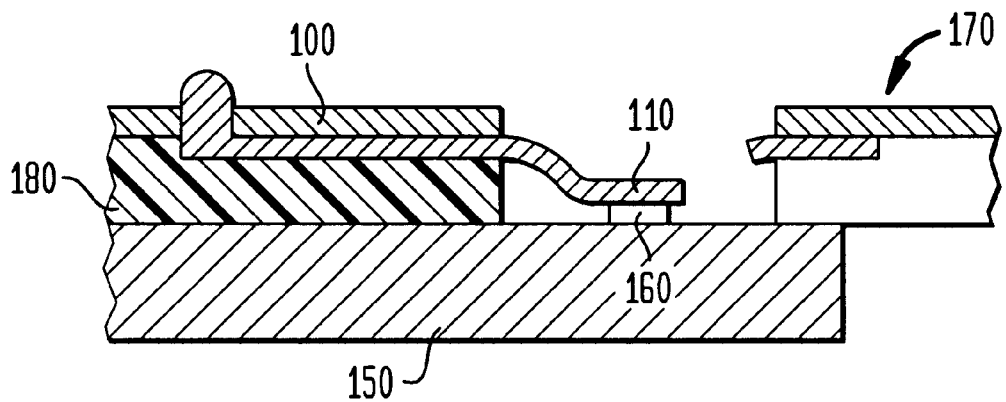
FIG. 3 shows a side view of a chip and a chip package having a bonded lead, according to the present invention.

1, conductive, plated bond ribbon leads 110 are positioned such that they extend above a gap 105 in a dielectric substrate 100 and are secured on at least one end to a first surface of the substrate 100. A measured amount of directed energy 120 is applied to at least a portion of the surface of the leads 110 within the gap 105. A mask 130 may be used to protect the substrate 100 while allowing the energy 120 to be applied to the surface of the leads 110. A surface layer 140 of each of the leads 110 is thereby recrystallized. Optimally, this recrystallization produces a lead with a surface layer region having a finer grain than the central region of the lead it overlies. Experimental results have shown that the treated leads are softer and more ductile; thus, the localized stresses of the resultant treated, bonded leads (shown in FIG. 3) during thermal cycling should be reduced, increasing the overall reliability of the package.

Although the present invention is not limited by any theory of operation, the treated leads' ability to better compensate for TCE mismatch and lead/contact bond integrity problems may be further aided in some embodiments by the directed energy creating one or more of the following further effects: smoothing of the exposed surface of the leads, densification of the surface layer, vaporization of the surface layers of contamination and driving of the co-deposited contaminates in the surface layer's grain boundary into the grain itself. Whether these optional beneficial effects occur in a particular embodiment will depend on the material of the lead, the type of directed energy used, the desired characteristics for a given chip package, etc.

The dielectric substrate 100 may be made of a rigid, semi-rigid or flexible material; however, preferably the substrate 100 is comprised of a thin dielectric film layer comprised of a flexible, but substantially inextensible, film circuit element, formed from a polymeric material such as polyimide with an approximate thickness of between 25 $\mu$m and 100 $\mu$m. A typical lead 110 may be any size or thickness; however, as the size of chip packages are minimized, the corresponding size of the leads are also minimized. Today, it is not uncommon for a lead thickness to be on the order of about 10 to 50 microns thick.

The lead material is preferably comprised of a highly conductive, ductile metal such as gold. Gold is also preferred for a lead material because of its compatibility with chip contacts, which are typically comprised of aluminum. However, many other conductive materials may be used, such as copper, nickel, titanium, palladium and combinations and alloys thereof, and composites thereof (as described in more detail below).

A back plate (not shown) may be positioned on the side of the substrate 100 opposite the mask to stop the directed energy so that it does not do damage to any surrounding materials or equipment. It should be noted that both the mask 130 and the back plate should be comprised of materials which reflect substantially all of the directed energy 120 being applied to the lead 110. Otherwise, the energy 120 will likely cause a plasma-like cloud of mask and/or back plate material which could imbed itself in the surface layer of the lead during application of the directed energy 120 and become a source of contamination for the lead 110. As discussed earlier, such contamination may inhibit the bond between the lead and a chip contact and further affects the ductility of the lead making the lead more susceptible to fatigue fractures during thermal cycling. Typical suitable materials for the mask and/or back plate to minimize such contamination include molybdenum, tungsten, nickel or titanium.

The directed energy 120 may be from any number of possible sources having the ability to rapidly heat to the point of recrystallizing localized portions of the surface layer of the leads. Examples of possible directed energy sources include ion beam, plasma arc, flash lamp, electron beam or laser beam (typically a YAG laser or excimer laser beam). The type of energy is not critical so long as the energy may be absorbed by the lead material. The amount of energy required to recrystallize the leads up to a desired thickness will be a factor of the thermal diffusivity of the lead material chosen and the time of application of the energy chosen, and will follow the following equation:

$$\lambda = \sqrt{D\tau}$$

where $\lambda$ represents the thermal diffusion length, D represents the lead material's coefficient of thermal diffusivity; and $\tau$ represents the period of time the directed energy 120 is applied to a particular portion of the lead. Typically, the energy is applied in short pulses, at a set frequency, such that the portions of the lead to which the energy has been applied heat up quickly to a temperature which is known to liquefy up to a given thickness of the lead material in the amount of time the energy is applied. Although, one skilled in the art will appreciate that scanning the directed energy across the lead in a continuous localized fashion will have the same or a substantially similar result as applying the directed energy in short pulses. The directed energy may also be applied in an atmosphere which facilitates recrystallization of the surface layer and/or inhibits the formation of surface contamination on the lead (such as ambient air, or other gas or combination of gases). One point to note is that the duration of time that the energy is directed at any one point on a lead must be less than the time required to permanently damage the lead at that point or to cause the lead to collapse under its own weight In some embodiments, the recrystallized surface layer may actually be temporarily melted and resolidified creating the aforementioned fine grain, recrystallized structure. However, generally, the portions of the lead affected by the directed energy will recrystallize (and in some cases resolidify) quickly after the application of the directed energy. The result of this process is to recrystallize the treated surface layer of the plated lead such that it has a fine grained equiax structure. Depending on certain factors, such as the type of directed energy used, the duration of application, etc., the surface layers of contamination on the leads, if any, may also be vaporized by the directed energy. The recrystallization may further have the effect of densifying the lead structure thereby reducing the likelihood that the porosity of the plated lead will play a major part in initiating a fatigue fracture site during thermal cycling of the bonded lead. Further, in some embodiments, a thin amorphous layer (on the order of about 0.25–0.75 microns) may be created on the surface of the lead.

Figure 2A:
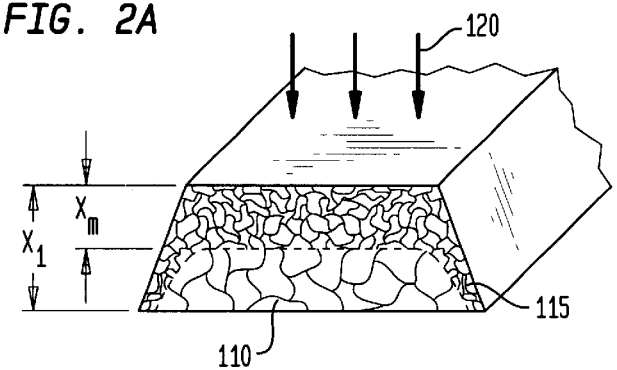
FIG. 2A shows a fragmentary perspective view of a treated lead, according to the present invention.
Figure 2B:
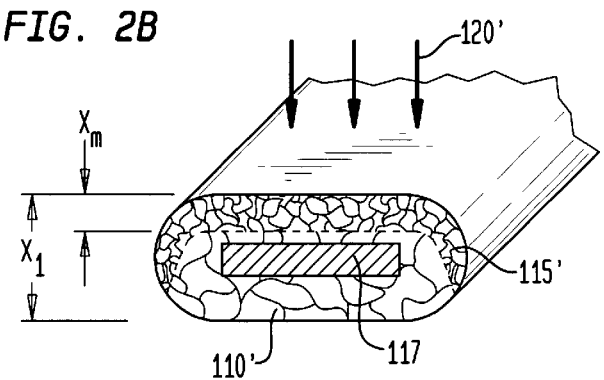
FIG. 2B shows fragmentary perspective view of a treated composite lead, according to the present invention.
Figure 2C:
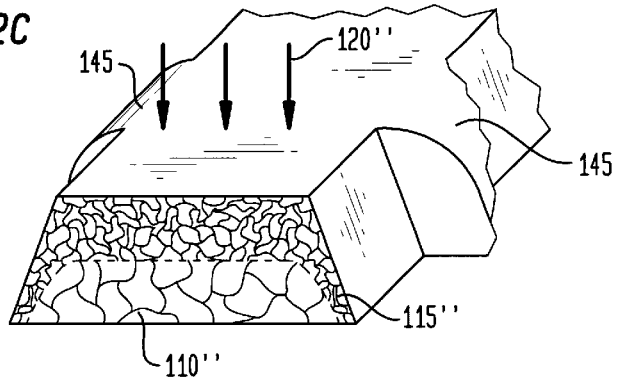
FIG. 2C shows fragmentary perspective view of a treated lead having protrusions thereon, according to the present invention.

Referring now to the fragmentary views in FIGS. 2A–C, the directed energy has recrystallized a portion 115 of the lead 110 to a thickness of $X_m$, where $X_1$ stands for the total thickness of the lead. FIG. 2A shows a trapezoidal lead with the directed energy being applied on one side thereof. As shown in this Figure, if the sides of the leads are sloped or canted, a portion of the surface layer of the side of the lead will also be recrystallized. This way, the directed energy may be applied to multiple sides of the lead such that a surface layer of recrystallized lead material up to a desired depth ($X_m$) is also recrystallized substantially or completely around the un-recrystallized central region or lead core 110. Of course, the directed energy could also be applied to all surfaces of the lead as well. In fact, since the affected portions 115 are localized and recrystallize in the tens of nano-seconds range, virtually the entire lead area may be recrystallized without causing the lead to collapse or deform (depending on the lead material). Thus, the key to this technique is to control the intensity and duration of the applied directed energy thereby allowing a surface layer up to the better part of the lead itself to be recrystallized. The aforementioned possible amorphous layer is not shown in FIG. 2A; however, this thin layer would create a smooth exposed surface which would overlie the fine grain, recrystallized layer 115.

FIG. 2B shows an alternative embodiment wherein the directed energy 120' is being applied to a composite lead 110'/117 to recrystallize a surface layer 115 of the lead. An example of such a composite lead would include a copper core 117 having a relatively thick gold layer 110' plated therearound. Other examples include a nickel core 117 and a gold outer layer 110' or a copper core 117 with a thin layer of nickel plated therearound (not shown) and a gold layer 110' plated atop the nickel layer (the nickel layer thus acting as a barrier layer between the copper and the gold). In another alternative embodiment, a bond ribbon lead core 117 made of a conductive, superplastic material (such as nickel-titanium generically known in some configurations as nitinol) is used and has a gold layer plated therearound. The superplastic material has superior fatigue resistance to thermal cycling, while the gold layer improves the lead's conductivity and the lead's bondability to a chip contact. The composite lead embodiments listed here are exemplary only, and not intended to be exhaustive of each and every possible alternative composite lead combination.

Figure 1:
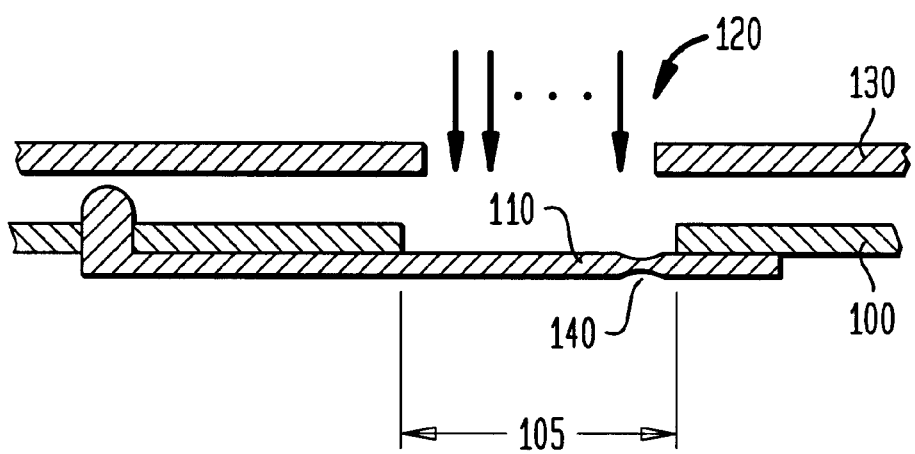
FIG. 1 shows a fragmentary side view of one embodiment of the treatment of a conductive lead, according to the present invention.

FIG. 1 further shows a weak point 140 in the lead which allows the lead to be more easily detached using a bonding tool (not shown) at or near an edge of the gap 105 so that the tool may position the lead above a chip contact 160 (FIG. 3) and bond the lead thereto, typically using thermocompression, ultrasonic energy or a combination thereof, as described in more detail in the application corresponding to WIPO Publication No. WO 94/03036 published on Feb. 3, 1994, the contents of which are hereby incorporated by reference herein. FIG. 2C shows a protruding feature 145 which may be used by a bonding tool to help position a lead over a chip contact 160, as described in more detail in U.S. patent application No. 08/308,741 filed Sep. 19, 1994. Such special lead features must be taken into account when applying the directed energy 120 to the lead. If the weak point is comprised of a thinned area of the lead 110, the intensity of the applied directed energy should be reduced over the weak point in order to reduce the likelihood that the lead will be damaged or collapse. Alternately, the intensity of the energy 120 may be kept steady, but the time period of application of the directed energy may be reduced. While the lead is typically wider in the area of the protruding feature 145, the intensity of the directed energy 120 should be monitored so that the protruding feature is not absorbed into the rest of the lead during the recrystallization of that portion of the surface of the lead. This will also depend, in part, on the amount of the surface of the lead which is being treated at any given time. Other slight modifications to the process may be made to compensate for lead features without departing from the present invention.

Figure 2D:
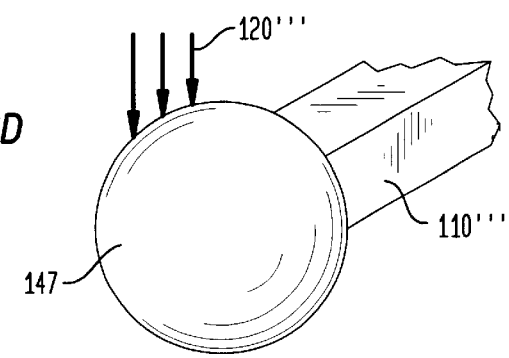
FIG. 2D show another fragmentary perspective view of a lead according to the present invention.

FIG. 2D shows a further embodiment where the lead 110''' is attached to the first surface of the substrate 100 and extends into and is cantilevered over the gap 105 (shown in FIG. 1). The lead 110''' terminates in a feature 147 having larger dimensions than the lead itself, such as the spherical feature 147 shown in FIG. 2D. The directed energy 120''' is then applied so as to recrystallize a surface layer of at least a portion of the feature 147, if not the entire lead 110''' within the gap 105. A ductile lead material is thereby provided in the affected surface layer portions potentially allowing for better bonding characteristic of the lead to a chip contact.

The application of energy 120 to the surface layer of the lead 110 also has the effect of vaporizing much of the surface contamination on the lead due to such sources as the electroplating operations, contamination from other portions of the fabrication process or subsequent oxidation of the metal, etc. This vaporization of the surface contamination facilitates the subsequent creation and maintenance of a good intermetallic bond between the lead and a chip contact As described above, such contamination may cause a breakdown in the intermetallic bond at elevated temperatures. Because the lead 110 is being impinged upon by the directed energy, virtually all contamination which was codeposited during the plating of the lead will be quenched away from the grain boundary and into the grain itself in the recrystallized portion 115 (FIG. 2). Thus, this removal of co-deposited contamination further provides for a softer, more ductile, finer grain material in the recrystallized portion 115 which in turn produces a lead which is better able to deal with the stresses due to thermal cycling of the chip. A typical lead (shown in FIG. 3 juxtaposed with the chip 150 with a compliant layer 180 interposed therebetween) will undergo movement in a full range of motion (x-y-z) during thermal cycling. It is thus believed that the removal of contamination is advantageous so as to prolong the life of the electrical and mechanical connection therebetween.

Figure 4A:
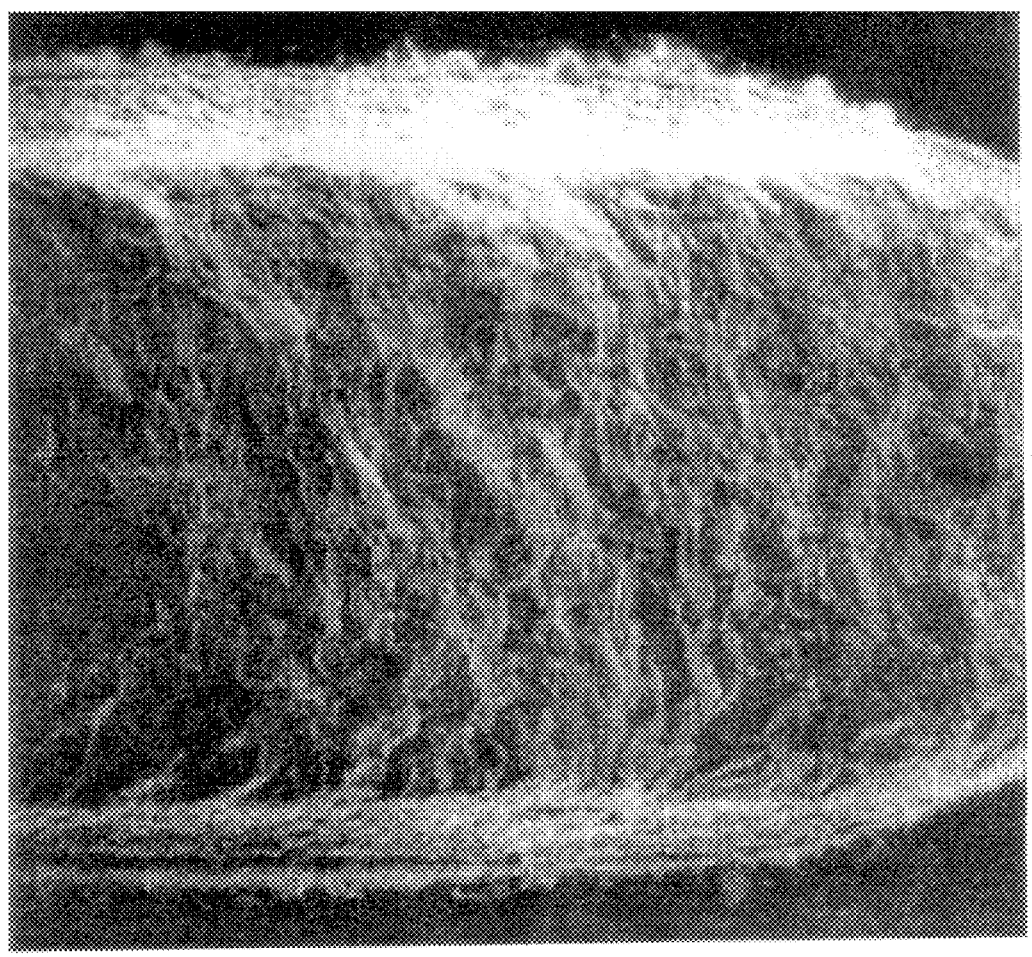
FIGS. 4A and 4B show high resolution photographs of the top view of the surface of a typical plated gold lead at varying magnifications.
Figure 4B:
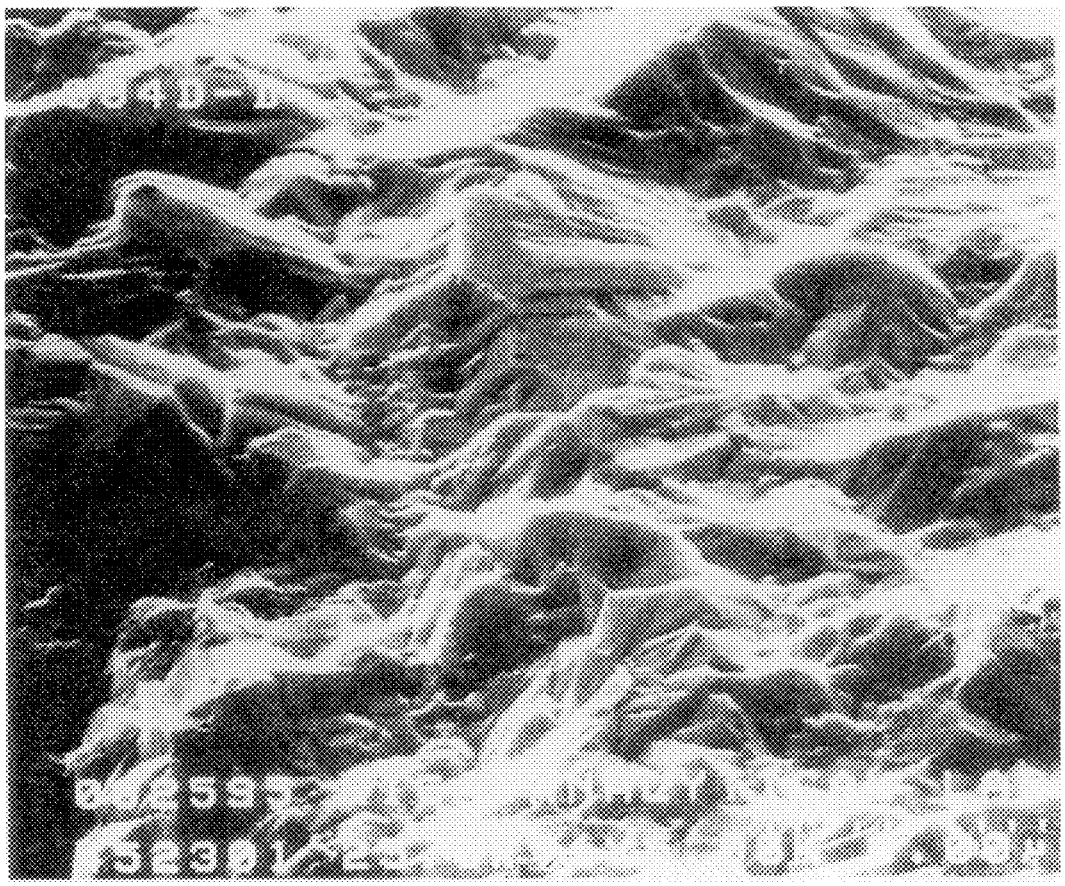
Figure 4C:
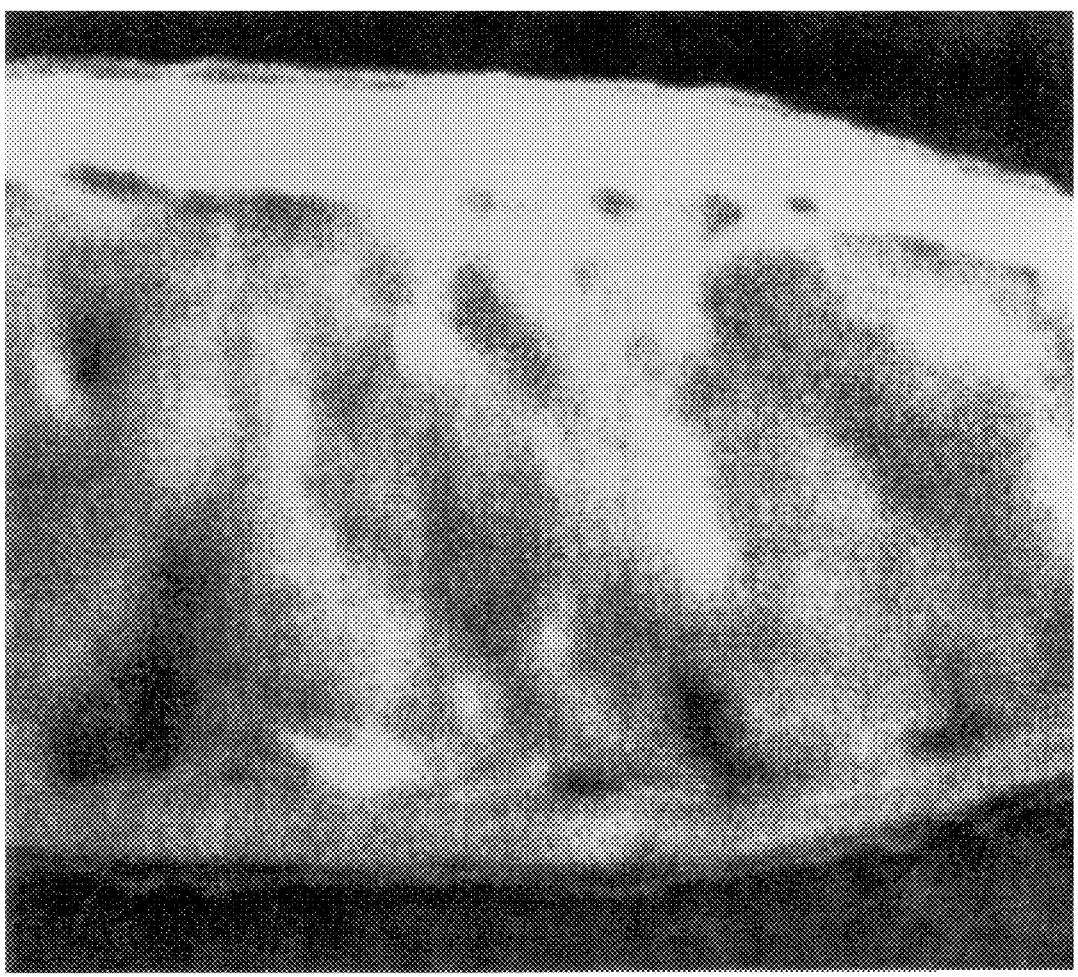
FIGS. 4C and 4D show high resolution photographs of the top view of the surface of a gold plated lead similar to the lead shown in FIGS. 4A and 4B after treatment of the lead and at varying magnifications, according to the present invention.
Figure 4D:
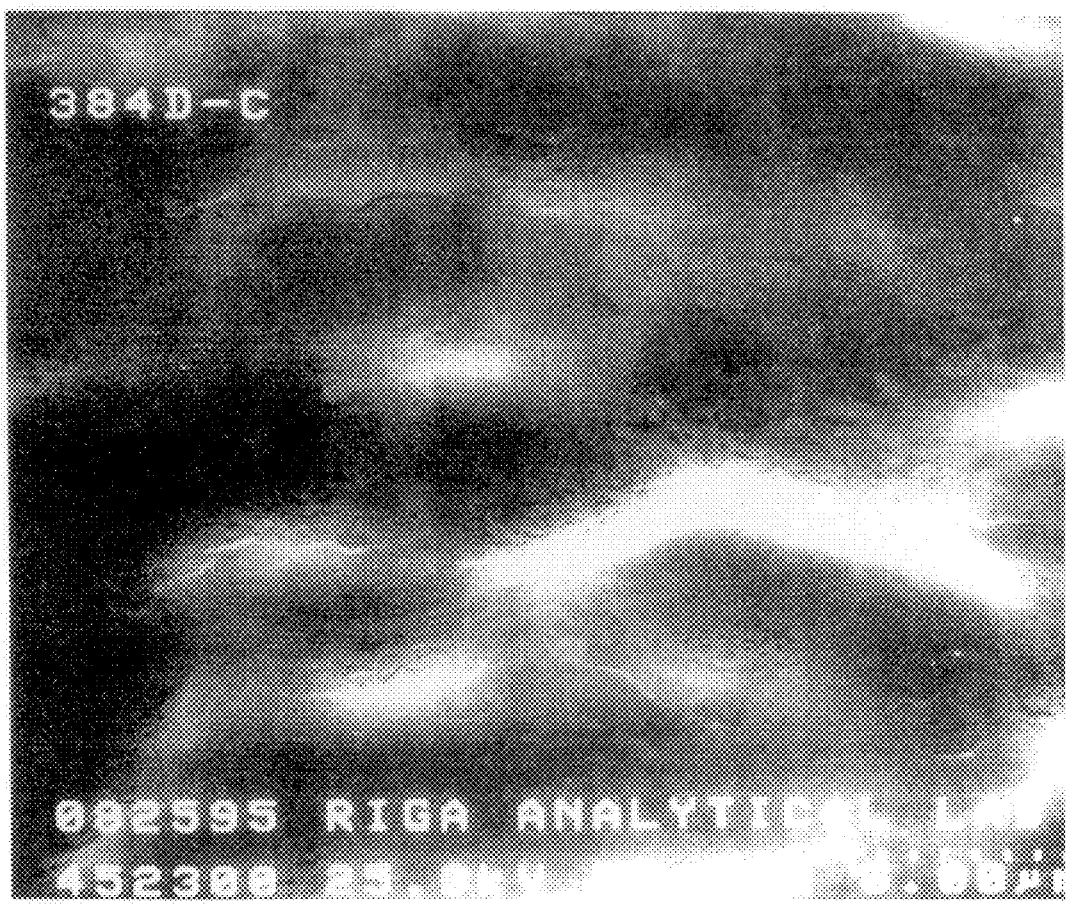

In a preferred embodiment, an excimer laser is used as the directed energy source. Excimer lasers typically have a wavelength of approximately 248 nanometers ("nm"). As described above, the laser uses short pulses of energy having a pulse width of approximately between 10 and 30 nanoseconds("ns"). The frequency of the pulses is less critical since the lead locally heats up and cools (thus recrystallizing) in the tens of nanoseconds range, before the arrival of the next pulse which is typically in the millisecond range. An example of the use of an excimer laser on a lead's surface can be seen in FIGS. 4A–4C. FIG. 4A shows a high resolution photograph of a typical plated gold lead at a magnification of 1200 times normal size. FIG. 4B shows a photograph of the same lead at 5000 times normal size. The surface of this plated lead can be seen to be substantially non-planar due to the coarse crystalline structure of the plated lead. FIG. 4C shows a high resolution photograph of a gold plated lead which is similar to the lead shown in shown FIGS. 4A and 4B at a magnification of 1200 times normal size. The lead in FIG. 4C has been treated according to the method described above such that a surface layer of the lead has been recrystallized using an excimer laser as the directed energy source. FIG. 4D shows the lead shown in FIG. 4C at 5000 times magnification. The surface of the lead is smoother, the gold is more dense and ductile due to the recrystallization of the surface layer and the contamination on the surface and within the surface layer has been substantially reduced.

As noted above, it is important that the amount of directed energy from the excimer laser being used to impinge upon the lead 110 is balanced such that thickness $X_m$ (FIG. 2) is sufficiently large to produce the desired thickness of fine grain, recrystallized lead material 115 while at the same time making sure that the impingement of the laser energy does not exceed a thickness which will cause the lead to be deformed or to collapse under its own weight during the energy application step. The desired thickness of the recrystallized portion will be a factor of the material selected to comprise the lead and of the geometry of the lead itself, i.e.

cylindrical or trapezoidal, etc. If all of the surfaces of a lead within the gap are to be treated with the energy from the excimer laser to recrystallize only a surface layer of the lead itself, a typical percentage of the lead to be recrystallized is approximately between 2 and 50 percent, and preferably between 4 and 20 percent, of the total lead. For example, a typical thickness $X_m$ for a 25 micron gold lead ($X_1$) is approximately between 0.5 microns and 12.5 microns, and preferably about between 1.0 micron and 5 microns. The leads which have been treated using an excimer laser as the directed energy source appear to be more ductile, less contaminated, have better surface planarity and have better lead/contact bond integrity than before the treatment.

Having fully described several embodiments of the present invention, it will be apparent to those of ordinary skill in the art that numerous alternatives and equivalents exist which do not depart from the invention set forth above. It is therefore to be understood that the present invention is not to be limited by the foregoing description, but only by the appended claims.

What is claimed is:

1. A compliant lead for a microelectronic device, comprising:
   a conductive lead which has a central region of coarse grain material and a surface layer region integral with and defining a surface over at least a portion of the central region, the surface layer region having a grain structure which is finer than the central region, wherein said lead is electronically interconnected with said microelectronic device.

2. The lead as claimed in claim 1, wherein the lead has a cross sectional thickness of between about 10 and 50 microns.

3. The lead as claimed in claim 1, wherein the surface layer region has less contamination at its grain boundaries than the central region.

4. The lead as claimed in claim 3, wherein the surface comprises approximately between 2 and 50 percent of the total lead cross sectional area.

5. The lead as claimed in claim 4, wherein the conductive leadis selected from one or more of the group consisting of gold, copper, nickel, titanium, palladium, nitinol and combinations and alloys thereof.

6. The lead as claimed in claim 5, wherein an amorphous layer overlies the surface layer.

7. The lead as claimed in claim 5, wherein the surface layer region completely surrounds the central region.

8. The lead as claimed in claim 1, wherein the surface layer of the lead and the central region of the lead are formed from a common metal.

9. The lead as claimed in claim 1, wherein said lead has a thickness of 10 to 50 microns.

10. The lead as claimed in claim 9, wherein the surface layer region has less contamination at its grain boundaries than the central region.

11. The lead as claimed in claim 9, wherein the surface comprises approximately between 2 and 49 percent of the total lead cross sectional area.

12. The lead as claimed in claim 9, wherein the conductive lead is selected from one or more of the group consisting of gold, copper, nickel, titanium, palladium, nitrinol and combinations and alloys thereof.

13. The lead as claimed in claim 9, wherein an amorphous layer overlies the surface layer.

14. The lead as claimed in claim 9, wherein the surface layer region completely surrounds the central region.

15. The lead as claimed in claim 9, wherein said surface layer region has a thickness that is approximately 2–50% of the cross sectional thickness of said lead.

16. The lead as claimed in claim 9, wherein said surface layer region of said lead has a thickness that is approximately 4–20% of the cross sectional thickness of said lead.

17. The lead as claimed in claim 9, wherein the surface layer region of said lead has a thickness of approximately 0.5–12.5 microns.

18. The lead as claimed in claim 9, wherein the thickness of said lead is approximately 10–50 microns and the thickness of said surface layer region is approximately 2–50% of the thickness of said lead.

19. A microelectronic assembly comprising:
   a microelectronic element including one or more contacts; and
   one or more conductive leads connected to said one or more contacts, wherein each said lead has a central region of coarse grain material and a surface layer region integral with and defining a surface over at least a portion of the central region, the surface layer region having a grain structure which is finer than the central region.

20. The microelectronic assembly as claimed in claim 19, wherein the surface layer of the lead and the central region of the lead are formed from a common metal.

21. The microelectronic assembly of claim 19, wherein at least one of said leads has a cross sectional thickness of between about 10 and 52 microns.

22. The microelectronic assembly as claimed in claim 19, wherein the surface layer region has less contamination at its grain boundaries than the central region.

23. The microelectronic assembly as claimed in claim 19, wherein the surface layer region of said lead comprises between approximately 2–50 percent of the total lead cross sectional area.

24. The microelectronic assembly as claimed in claim 19, wherein said lead is selected from one or more of the group consisting of gold, copper, nickel, titanium, palladium, nitinol and combinations and alloys thereof.

25. The microelectronic assembly as claimed in claim 19, wherein an amorphous layer overlies the surface layer region of said lead.

26. The microelectronic assembly as claimed in claim 19, wherein the surface layer region completely surrounds the central region.

27. The lead as claimed in claim 19, wherein said surface layer region has a thickness that is approximately 2–50% of the cross sectional thickness of said lead.

28. The lead as claimed in claim 19, wherein said surface layer region of said lead has a thickness that is approximately 4–20% of the cross sectional thickness of said lead.

29. The lead as claimed in claim 19, wherein the surface layer region of said lead has a thickness of approximately 0.5–12.5 microns.

30. The lead as claimed in claim 19, wherein the cross-sectional thickness of said lead is approximately 10–50 microns and the thickness of said surface layer region is approximately 2–50% of the thickness of said lead.

* * * * *

UNITED STATES PATENT AND TRADEMARK OFFICE
CERTIFICATE OF CORRECTION

PATENT NO. : 6,215,191 B1
DATED : April 10, 2001
INVENTOR(S) : Beroz et al.

It is certified that error appears in the above-identified patent and that said Letters Patent is hereby corrected as shown below:

Column 1,
Line 29, "lever" should read -- level --.

Column 4,
Line 15, "resolidified" should read -- re-solidified --.

Column 6,
Line 11, "$\sqrt{\sqrt{D_\tau}}$" should read -- $\sqrt{D_\tau}$ --.

Column 8,
Line 11, "contact" should read -- contact. --.
Line 15, "codeposited" should read -- co-deposited --.
Line 31, "nanometers" should read -- nano-meters --.
Line 36, "nanoseconds" should read -- nano-seconds --.

Column 9,
Line 41, "leadis" should read -- lead is --.

Signed and Sealed this

Thirteenth Day of November, 2001

Attest:

NICHOLAS P. GODICI
Attesting Officer       Acting Director of the United States Patent and Trademark Office